US009620853B2

(12) United States Patent
Cohen et al.

(10) Patent No.: US 9,620,853 B2
(45) Date of Patent: *Apr. 11, 2017

(54) METHODS AND APPARATUS FOR ENHANCED RADIATION CHARACTERISTICS FROM ANTENNAS AND RELATED COMPONENTS

(71) Applicant: Fractal Antenna Systems, Inc., Waltham, MA (US)

(72) Inventors: Nathan Cohen, Belmont, MA (US); Michael Chin, Boston, MA (US)

(73) Assignee: Fractal Antenna Systems, Inc., Bedford, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/714,844

(22) Filed: May 18, 2015

(65) Prior Publication Data

US 2015/0255861 A1    Sep. 10, 2015

Related U.S. Application Data

(63) Continuation of application No. 12/761,283, filed on Apr. 15, 2010, now Pat. No. 9,035,849.

(60) Provisional application No. 61/169,351, filed on Apr. 15, 2009, provisional application No. 61/187,459, (Continued)

(51) Int. Cl.
*H01Q 1/30* (2006.01)
*H01Q 1/36* (2006.01)
*H01Q 15/00* (2006.01)
*H01L 31/042* (2014.01)
(Continued)

(52) U.S. Cl.
CPC ............ *H01Q 1/36* (2013.01); *H01L 31/042* (2013.01); *H01Q 1/288* (2013.01); *H01Q 15/0013* (2013.01); *H01Q 15/0026* (2013.01); *H01Q 15/0093* (2013.01); *H01Q 19/00* (2013.01); *Y02E 10/50* (2013.01)

(58) Field of Classification Search
CPC ................................................. H01Q 15/0013
USPC ........................................................ 343/899
See application file for complete search history.

(56) References Cited

U.S. PATENT DOCUMENTS

| 4,342,036 A * | 7/1982 | Scott et al. | 343/836 |
| 4,814,785 A * | 3/1989 | Wu | 343/909 |
| 5,344,729 A * | 9/1994 | Akins et al. | 430/5 |

(Continued)

OTHER PUBLICATIONS

"Antenna Frequency Scaling," The ARRL Antenna Book, 1988, pp. 2-24 to 2-25.

(Continued)

*Primary Examiner* — Graham Smith
(74) *Attorney, Agent, or Firm* — McDermott Will & Emery

(57) ABSTRACT

Aspect of the present disclosure are directed to methods and apparatus producing enhanced radiation characteristics, e.g., wideband behavior, in or for antennas and related components by providing concentric sleeves, with air or dielectric material as a spacer, where the sleeves include one or more conductive layers, at least a portion of which includes fractal resonators closely spaced, in terms of wavelength. A further aspect of the present disclosure is directed to surfaces that include dual-use or multiple-use apertures. Such aperture engine surfaces can include a top (or first) layer of antenna arrays, a middle (or second) layer of a metal-fractal backplane player, and a third (or bottom) layer for solar cell or solar oriented power collection.

14 Claims, 4 Drawing Sheets

Related U.S. Application Data filed on Jun. 16, 2009, provisional application No. 61/222,614, filed on Jul. 2, 2009.

(51) Int. Cl.
  *H01Q 1/28* (2006.01)
  *H01Q 19/00* (2006.01)

(56) References Cited

U.S. PATENT DOCUMENTS

| | | | |
|---|---|---|---|
| 5,471,224 A * | 11/1995 | Barkeshli | 343/909 |
| 6,104,349 A | 8/2000 | Cohen | |
| 6,127,977 A | 10/2000 | Cohen | |
| 6,140,975 A | 10/2000 | Cohen | |
| 6,445,352 B1 | 9/2002 | Cohen | |
| 6,452,553 B1 | 9/2002 | Cohen | |
| 6,476,766 B1 | 11/2002 | Cohen | |
| 6,985,122 B2 | 1/2006 | Cohen | |
| 7,019,695 B2 | 3/2006 | Cohen | |
| 7,126,537 B2 | 10/2006 | Cohen | |
| 7,145,513 B1 | 12/2006 | Cohen | |
| 7,176,838 B1 | 2/2007 | Kinezos | |
| 7,190,318 B2 | 3/2007 | Cohen | |
| 7,215,290 B2 | 5/2007 | Cohen | |
| 7,256,751 B2 | 8/2007 | Cohen | |
| 7,345,642 B2 | 3/2008 | Cohen | |
| 7,456,799 B1 | 11/2008 | Cohen | |
| 2003/0034918 A1 * | 2/2003 | Werner et al. | 343/700 MS |
| 2004/0227682 A1 * | 11/2004 | Anderson | 343/742 |
| 2005/0007289 A1 * | 1/2005 | Zarro et al. | 343/786 |

OTHER PUBLICATIONS

Fano Bounds for Compact Antennas, Phase 1, JC Allen and J. Meloling, Technical Report 1962, Oct. 2007, SSC San Diego, pp. i to 1.

* cited by examiner

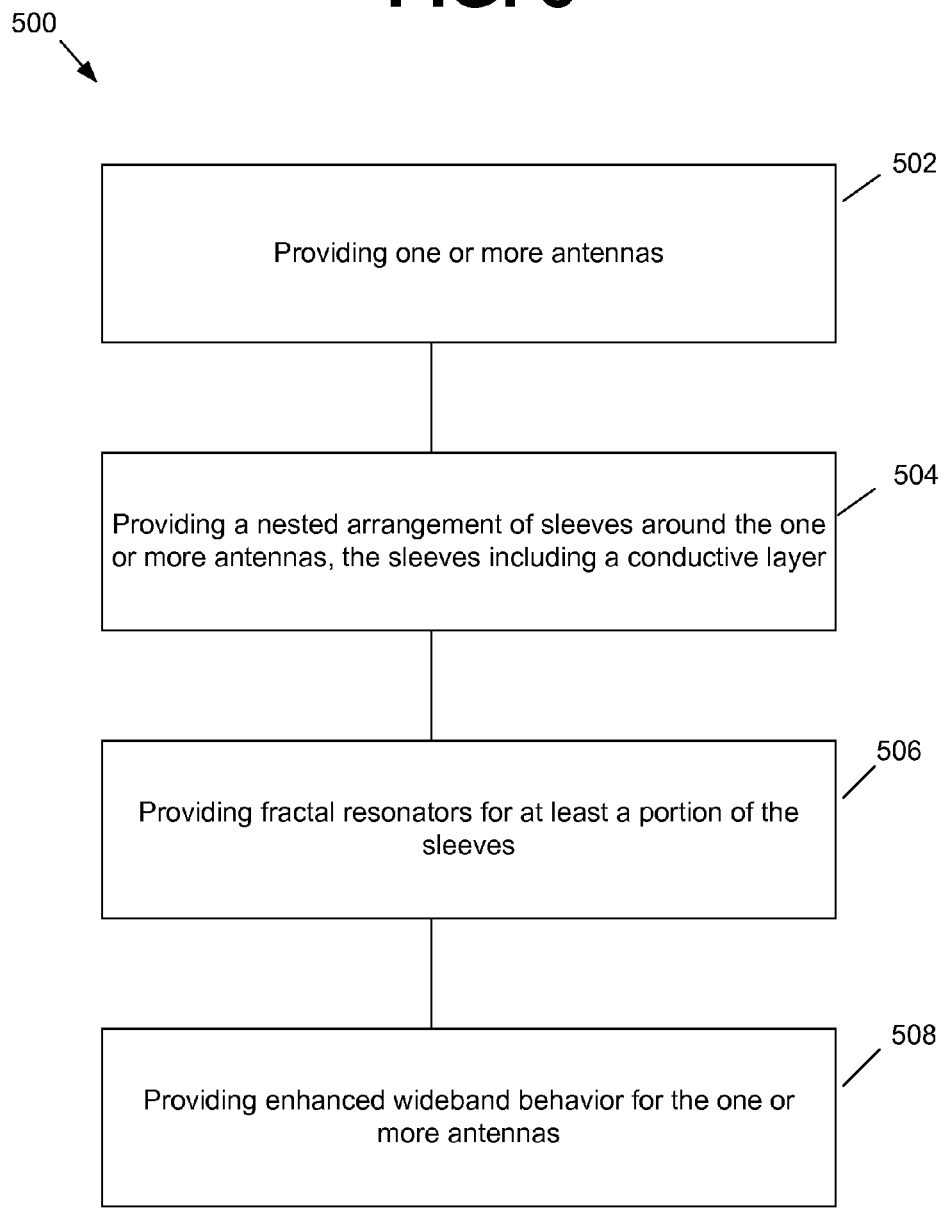

METHODS AND APPARATUS FOR ENHANCED RADIATION CHARACTERISTICS FROM ANTENNAS AND RELATED COMPONENTS

RELATED APPLICATIONS

This application is a continuation of U.S. application Ser. No. 12/761,283, filed Apr. 15, 2010, to be issued as U.S. Pat. No. 9,035,849 on 19 May 2015, which claims priority to and benefit of: (i) U.S. Provisional Patent Application No. 61/169,351, filed 15 Apr. 2009 and entitled "Method and Apparatus for Enhanced Radiation Characteristics from Antennas and Related Components"; (ii) U.S. Provisional Patent Application No. 61/187,459, filed 16 Jun. 2009 and entitled "Satellites and Spacecraft with Aperture Engine Surfaces"; and (iii) U.S. Provisional Patent Application No. 61/222,614, filed 2 Jul. 2009 and entitled "Voice Activated Switching"; the entire contents of all of which applications are incorporated herein by reference.

BACKGROUND

Antennas are used to typically radiate and/or receive electromagnetic signals, preferably with antenna gain, directivity, and efficiency. Practical antenna design traditionally involves trade-offs between various parameters, including antenna gain, size, efficiency, and bandwidth.

Antenna design has historically been dominated by Euclidean geometry. In such designs, the closed area of the antenna is directly proportional to the antenna perimeter. For example, if one doubles the length of an Euclidean square (or "quad") antenna, the enclosed area of the antenna quadruples. Classical antenna design has dealt with planes, circles, triangles, squares, ellipses, rectangles, hemispheres, paraboloids, and the like.

With respect to antennas, prior art design philosophy has been to pick a Euclidean geometric construction, e.g., a quad, and to explore its radiation characteristics, especially with emphasis on frequency resonance and power patterns. Unfortunately antenna design has concentrated on the ease of antenna construction, rather than on the underlying electromagnetics, which can cause a reduction in antenna performance.

Practical antenna design traditionally involves trade-offs between various parameters, including antenna gain, size, efficiency, and bandwidth. Antenna size is also traded off during antenna design that typically reduces frequency bandwidth. Being held to particular size constraints, the bandwidth performance for antenna designs such as discone and bicone antennas is sacrificed, resulting in reduced bandwidth.

SUMMARY

Embodiments of the present disclosure can provide techniques, including systems and/or methods, that address problems noted previously.

An aspect of the present disclosure is directed to methods producing enhanced radiation characteristics, e.g., wideband behavior, in or for antennas and related components by providing concentric sleeves, with air or dielectric material as a spacer, where the sleeves include one or more conductive layers, at least a portion of which includes fractal resonators closely spaced, in terms of wavelength.

A further aspect of the present disclosure is directed to systems/apparatus producing enhanced radiation characteristics, e.g., wideband behavior, in or for antennas and related components by providing concentric sleeves, with air or dielectric material as a spacer, where the sleeves include one or more conductive layers, at least a portion of which includes fractal resonators closely spaced, in terms of wavelength.

A further aspect of the present disclosure is directed to surfaces that include dual-use or multiple-use apertures. Such aperture engine surfaces can include a top (or first) layer of antenna arrays, a middle (or second) layer of a metal-fractal backplane player, and a third (or bottom) layer for solar cells or solar oriented power collection.

Of course, one skilled in the art will appreciate that the foregoing or following embodiments and aspects can be combined in any practical combination.

It should be understood that other embodiments according to the present disclosure will become readily apparent to those skilled in the art from the following detailed description, wherein exemplary embodiments are shown and described by way of illustration. The systems and methods of the present disclosure are capable of other and different embodiments, and details of such are capable of modification in various other respects. Accordingly, the drawings and detailed description are to be regarded as illustrative in nature and not as restrictive.

BRIEF DESCRIPTION OF THE DRAWINGS

Aspects of the disclosure may be more fully understood from the following description when read together with the accompanying drawings, which are to be regarded as illustrative in nature, and not as limiting. The drawings are not necessarily to scale, emphasis instead being placed on the principles of the disclosure. In the drawings:

FIG. 5 depicts a box diagram of a method of enhancing antenna radiation characteristics, in accordance with exemplary embodiments of the present disclosure.

Figure 1:
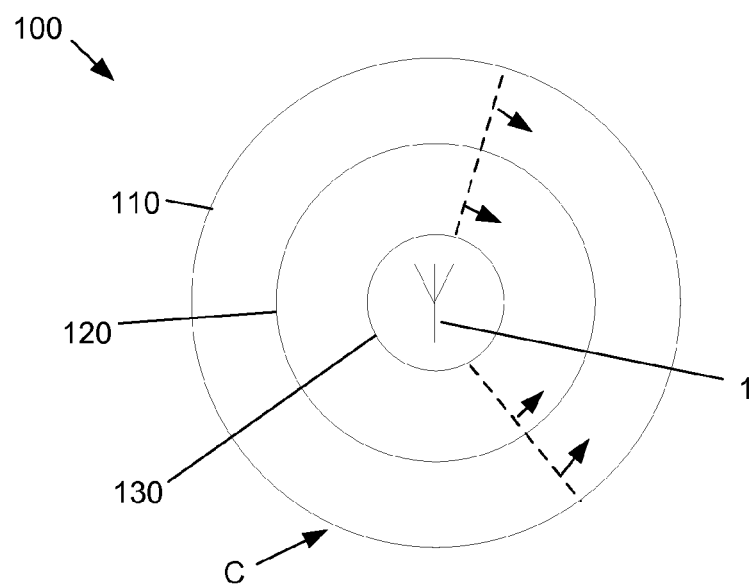
FIG. 1 depicts a diagrammatic end view of a radiation enhancement system utilizing a number of nested sleeves, in accordance with exemplary embodiments of the present disclosure.

While certain embodiments depicted in the drawings, one skilled in the art will appreciate that the embodiments depicted are illustrative and that variations of those shown, as well as other embodiments described herein, may be envisioned and practiced within the scope of the present disclosure.

DETAILED DESCRIPTION

In the following detailed description, numerous specific details are set forth to provide a full understanding of aspects and embodiments of the present disclosure. It will be apparent, however, to one ordinarily skilled in the art that aspects and embodiments of the present disclosure may be practiced without some of these specific details. In other instances, well-known structures and techniques have not been shown in detail to for ease in comprehension.

It is to be understood that both the foregoing summary of the present disclosure and the following detailed description are exemplary and explanatory and are not intended to limit the scope of the present disclosure. Moreover, with regard to terminology used herein, a reference to an element in the singular is not intended to mean "one and only one" unless specifically stated, but rather "one or more." The term "some" refers to one or more. Underlined and/or italicized headings and subheadings are used for convenience only, do not limit the present disclosure, and are not referred to in connection with the interpretation of the description of the present disclosure.

Aspects of the present disclosure are directed to methods and apparatus producing or enhancing radiation characteristics, e.g., wideband behavior, directionality, gain, etc., in antennas and related components by providing concentric sleeves, with air or dielectric material as a spacer, where the sleeves include one or more conductive layers, at least a portion of which includes fractal resonators closely spaced, in terms of wavelength.

FIG. 1 depicts a diagrammatic end view of a radiation enhancement system 100 utilizing a number of nested sleeves, in accordance with exemplary embodiments of the present disclosure. As depicted, system 100 can include a number of nested shells or sleeves, with three (sleeves 110, 120, and 130) being shown. As shown, the sleeves (110, 120, 130) can be configured around a pre-existing antenna 1 to enhances radiation characteristics, e.g., wideband behavior, directionality, gain, etc., of the antenna 1.

Figure 2:
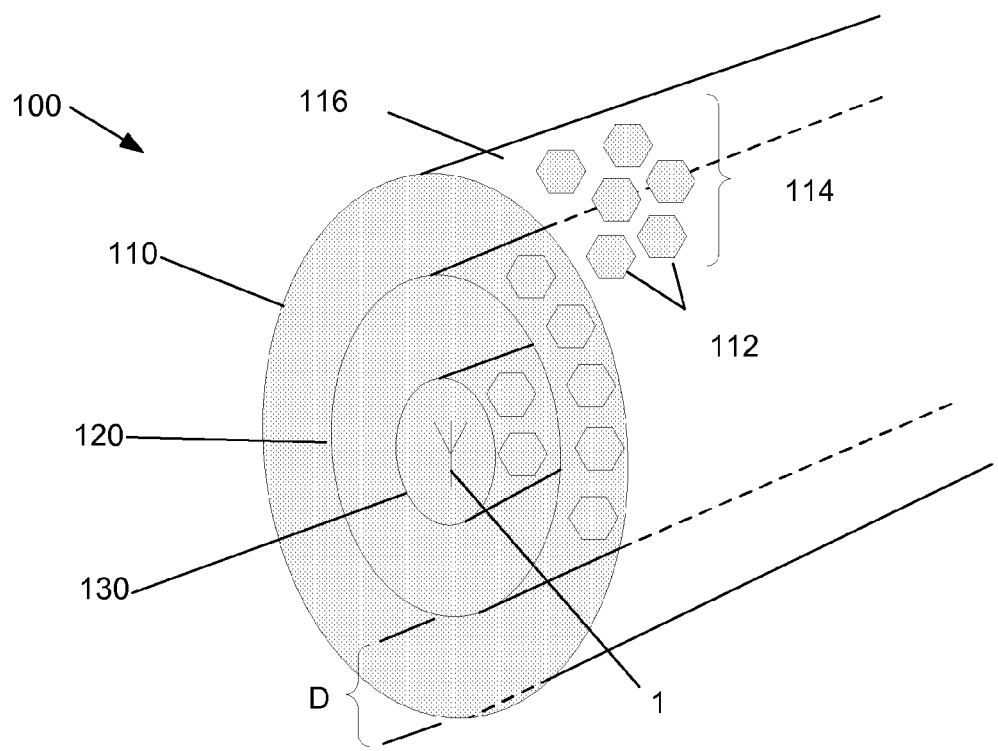
FIG. 2 depicts a perspective view of the system of FIG. 1.

Each of the sleeves (or shells), e.g., sleeve 110, can include one or more layers of dielectric substrates and a conductive portion or portions, e.g., layers or coatings, indicated by "C". Each conductive portion can include a conductive array or resonators or resonant structures (e.g., as shown in FIG. 2). A portion of the resonators or resonant structures can be configured as or include self-similar, or fractal, geometries. The sleeves (110, 120, 130) are not necessarily closed, e.g., about antenna 1, and can be open, as indicted by cutting planes with arrows.

FIG. 2 depicts a perspective view of the system 100 of FIG. 1. As shown, a sleeve (e.g., sleeve 110) can include a number of resonant conductive structures 112 configured in an array 114 on a dielectric substrate 116. Suitable dielectric substrates and materials (e.g., acting as spacers) can include, but are not limited to, polyimide, parylene, polyester, aramid, composite, glass, or similar materials, with suitable adhesives. As noted previously, a portion (or all) of the resonant structures can include resonators having a fractal geometry. The sleeves themselves, e.g., sleeves 110 and 120, can be separated by air or a suitable dielectric material, indicated by D.

With continued reference to both FIGS. 1-2, it should be appreciated that while sleeves 110, 120, and 130 are depicted as being concentric circular cylinders, this configuration of the sleeves is simply for ease in conveying features of the system 100. Other embodiments can actually be open shaped cylinders (i.e., open 2D shapes that extend in an orthogonal direction forming a surface) or nested surfaces that are not cylinders; moreover, the nested structures do not necessarily have to be exactly or substantially concentric.

As indicated previously, each shell or sleeve (e.g., sleeve 110 of FIG. 1) can include multiple resonators. The resonators can be repeated patterns of conductive traces. These conductive traces can be closed geometric shapes, e.g., rings, loops, closed fractals, etc. The resonator(s) can being self similar to at least second iteration. The resonators can include split-ring shapes, for some embodiments. The resonant structures are not required to be closed shapes, however, and open shapes can be used for such. In exemplary embodiments, the resonators are relatively closely packed, e.g., with adjacent separations less than about $\frac{1}{5}\lambda$ (or less) at lowest operational frequency. Other examples of separate distances between adjacent resonators or resonant dstructures can include any value between $\frac{1}{5}\lambda$ to $\frac{1}{10}\lambda$ inclusive at lowest operational frequency (e.g., which can be in VHF or UHF frequencies).

Figure 3:
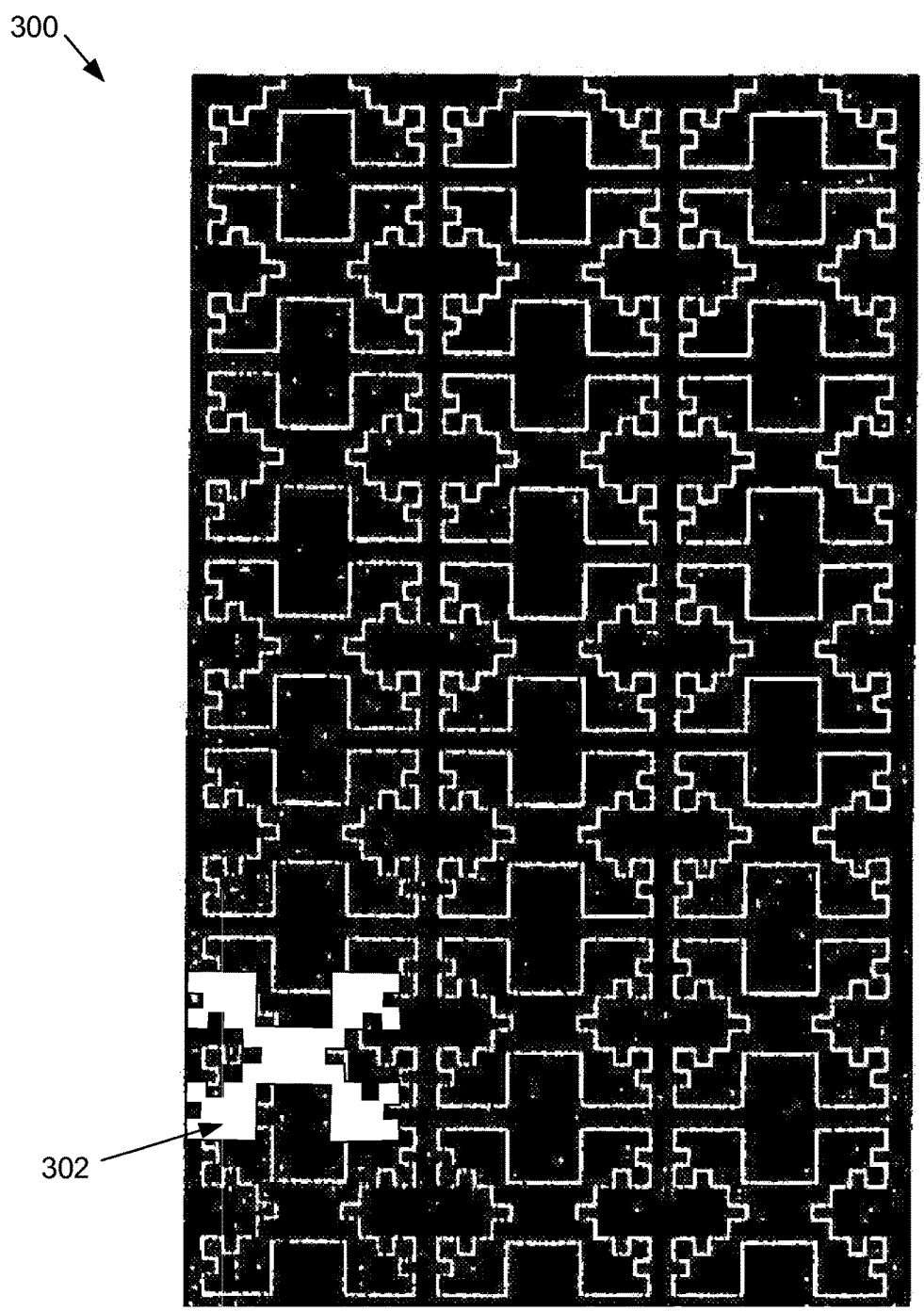
FIG. 3 depicts a portion of a sleeve that includes repeated conductive traces that are configured in a fractal-like shape, in accordance with exemplary embodiments of the present disclosure.

FIG. 3 depicts an exemplary embodiment of a shell or sleeve 300 (only a portion is shown) that includes repeated conductive traces that are configured in a fractal shape 302 (the individual closed traces). For the exemplary embodiment shown, each resonator shape 302 may be, e.g., about 1 cm on a side. The conductive trace is preferably made of copper. While exemplary fractal shapes are shown in FIG. 3, the present disclosure is not limited to such and any other suitable fractal shapes (including generator motifs) may be used in accordance with the present disclosure. The dimensions and type of fractal shape can be the same for each shell/sleeve type but can vary between shells/sleeves types. This variation (e.g., scaling of the same fractal shape) can afford increased bandwidth for some applications.

Examples of suitable fractal shapes for use in one or more resonators or resonator arrays of the nested sleeves can include, but are not limited to, fractal shapes described in one or more of the following patents, owned by the assignee of the present disclosure, the entire contents of all of which are incorporated herein by reference: U.S. Pat. No. 6,452,553; U.S. Pat. No. 6,104,349; U.S. Pat. No. 6,140,975; U.S. Pat. No. 7,145,513; U.S. Pat. No. 7,256,751; U.S. Pat. No. 6,127,977; U.S. Pat. No. 6,476,766; U.S. Pat. No. 7,019,695; U.S. Pat. No. 7,215,290; U.S. Pat. No. 6,445,352; U.S. Pat. No. 7,126,537; U.S. Pat. No. 7,190,318; U.S. Pat. No. 6,985,122; U.S. Pat. No. 7,345,642; and, U.S. Pat. No. 7,456,799.

Other suitable fractal shape for a resonator or resonant structures can include any of the following: a Koch fractal, a Minkowski fractal, a Cantor fractal, a torn square fractal, a Mandelbrot, a Caley tree fractal, a monkey's swing fractal, a Sierpinski gasket, and a Julia fractal, a contour set fractal, a Sierpinski triangle fractal, a Menger sponge fractal, a dragon curve fractal, a space-filling curve fractal, a Koch curve fractal, a Lypanov fractal, and a Kleinian group fractal.

Figure 4:
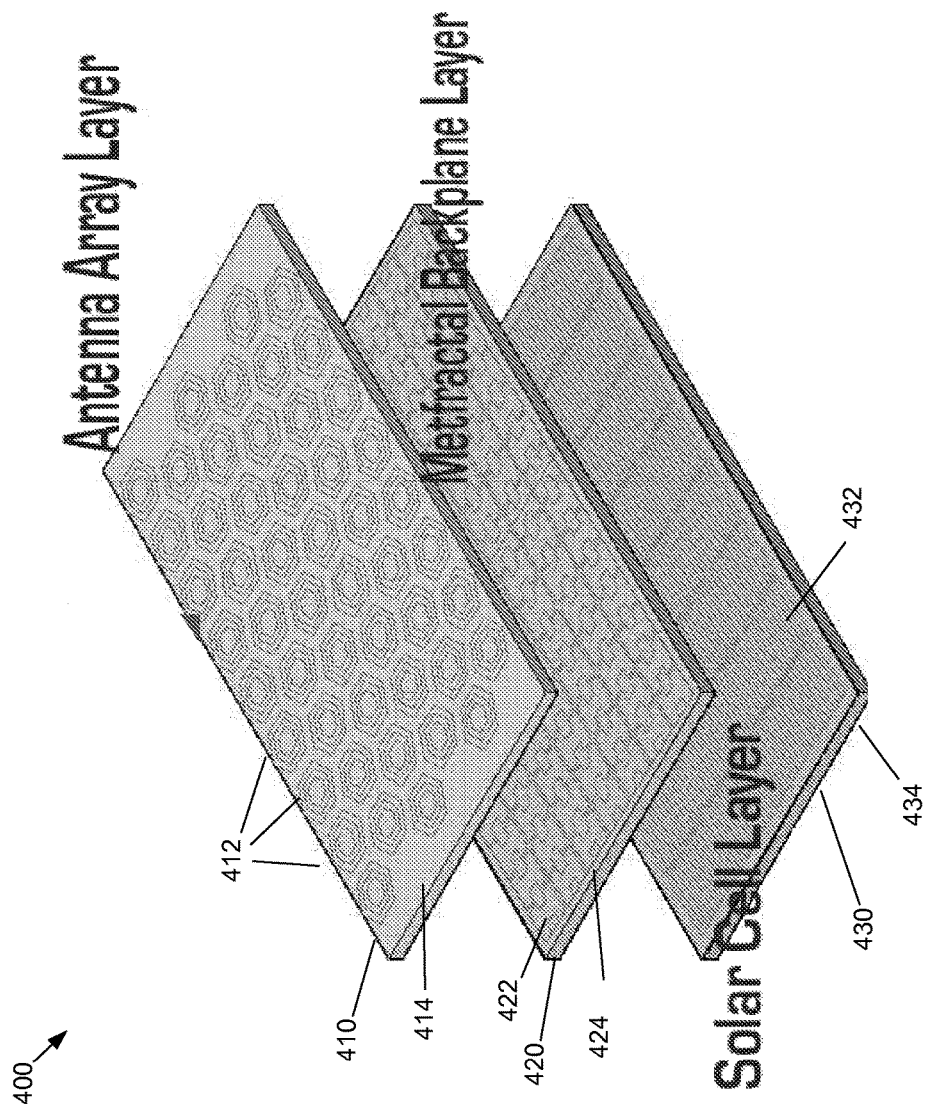
FIG. 4 depicts an exploded view of an aperture engine surface, in accordance with alternate embodiments of the present disclosure.

A further aspect of the present disclosure is directed to surfaces that include dual-use or multiple-use apertures. FIG. 4 depicts an exploded view of an aperture engine surface 400, in accordance with alternate embodiments of the present disclosure. Embodiments of the present disclosure also include one or more of such surfaces, which can be used for desired purposes. As shown in FIG. 4, such a surface 400 can include multiple layers, e.g., a top layer of antenna arrays 410, a middle layer of a metal-fractal backplane player 420, and a layer for solar cell or solar oriented power collection 430. Since the apertures for such embodiments can provide multiple functions such as collecting power (e.g., from the sun in exemplary embodiments) and then transmit the energy as RF radiation, they can be referred to as "engines" that depend on an "aperture," hence the term "aperture engine."

With continued reference to FIG. 4, the antenna array layer 410 may be composed of or include an array of antennas 412 on a dielectric substrate 414. The antennas 412 can include fractal antennas/resonators, which can afford higher gain for the given aperture. The fractal antennas 412 can be of a desired shape or include a desired fractal generator (e.g., a Sierpinski triangle or square, Koch, Hilbert, torn-square, Mandelbrot, Minkowski, which can be open or island forms). It should be noted that the elements depicted for the antenna layer in FIG. 4 are representative of individual fractals of desired shape (such as those just listed). The metal-fractal (Metfractal) backplane layer 420 can be treated or considered the same way. In other words, fractal antennas 422 of desired shape (e.g., fractal generator and dimensions) on a dielectric substrate 424 can be used. The solar cell layer can include arrays of photovoltaic cells 432 on a suitable sunbtrate 434. Exemplary embodiments of such aperture engine surfaces according to the present disclosure can include or be used with satellites or spacecraft that can have one or more aperture engine panels. Other embodiments can of course be included within the scope of the present disclosure, e.g., in remote environments having an abundance of sunlight. Moreover, other shapes of panels and/or antennas of the antenna array layer and/or fractal elements of the Metfractal Backplane Layer and/or solar cell layer may be used. Suitable solar panels, e.g., as commercially available, may be used.

FIG. 5 depicts a box diagram of a method 500 of enhancing antenna radiation characteristics, in accordance with exemplary embodiments of the present disclosure. As shown, one or more antennas can be provided, e.g., as described at 502. A nested arrangement of one or more sleeves can be provided, with each sleeve (or, shell) including an conductive layer or portion, e.g., as described at 504. Of course, for the case where a single sleeve or shell is utilized, the term "nested" is not applicable, strictly speaking. It should be noted that for some applications/embodiments, an antenna does not have to be separate from the one or more sleeves, meaning that the one or more sleeves themselves can function as or include one or more antennas.

Continuing with the description of method 500, a portion (or the entirety) of the one or more sleeves can be provided with fractal resonators or resonant structures (e.g., structure 302 of FIG. 3), e.g., as described at 506. Accordingly during operation, radiation characteristics of the antenna(s) can be improved or enhanced, e.g., as described at 508. Such radiation characteristics can include, but are not limited to, increasing the bandwidth, directionality, and/or gain of the antenna(s).

It will be appreciated that the resonant structures of the shells/sleeves according to the present disclosure may be formed or made by any suitable techniques and with any suitable materials. For example, semiconductors with desired doping levels and dopants may be used as conductive materials. Suitable metals or metal containing compounds may be used. Suitable techniques may be used to place conductors on/in a shell, including, but no limited to, printing techniques, photolithography techniques, etching techniques, and the like. Further, related components that can be used with enhanced antenna can include transceivers, transmitters, receivers, baluns, groundplanes, and the like.

It will also be appreciated that the shells may be made of any suitable material(s). Printed circuit board materials may be used. Flexible circuit board materials are preferred. Other material may, however, be used for the shells and the shells themselves can be made of non-continuous elements, e.g., a frame or framework. For example, various plastics may be used.

In exemplary embodiments, representative frequencies of operation can include those at VHF frequencies (e.g., 30-300 MHz) or higher, e.g., over a range of 500 MHz to 1.3 GHz, though others may of course be realized.

While embodiments are shown and described herein as having shells, sleeves, or cylinders in the shape of concentric rings (circular cylinders), such nested shapes can take other shapes in other embodiments. For example, one or more shells could have a generally spherical shape (with minor deviations for structural support). In an exemplary embodiment, the shells could form a nested arrangement of such spherical shapes, around an object to be shielded (at the targeted/selected frequencies/wavelengths). Moreover, the term "cylinder" can include not only reference to circular cylinders but any cylinder formed from a 2D line segment (joined or not) that extends along an axis orthogonal to the 2D line segment. For example, sleeve/shell cross-sections of angular shapes, e.g., triangular, hexagonal, may be used.

One skilled in the art will appreciate that embodiments and/or portions of embodiments of the present disclosure can be implemented in/with computer-readable storage media (e.g., hardware, software, firmware, or any combinations of such), and can be distributed and/or practiced over one or more networks. Steps or operations (or portions of such) as described herein, including processing functions to derive, learn, or calculate formula and/or mathematical models utilized and/or produced by the embodiments of the present disclosure, can be processed by one or more suitable processors, e.g., central processing units ("CPUs") implementing suitable code/instructions in any suitable language (machine dependent on machine independent).

While certain embodiments and/or aspects have been described herein, it will be understood by one skilled in the art that the methods, systems, and apparatus of the present disclosure may be embodied in other specific forms without departing from the spirit thereof.

For example, while certain wavelengths/frequencies of operation have been described, these are merely representative and other wavelength/frequencies may be utilized or achieved within the scope of the present disclosure.

Furthermore, while certain preferred fractal generator shapes have been described others may be used within the scope of the present disclosure. Accordingly, the embodiments described herein are to be considered in all respects as illustrative of the present disclosure and not restrictive.

What is claimed is:

1. An antenna system configured to operate over a predetermined frequency range from a first frequency ($f_1$) corresponding to a first wavelength ($\lambda_1$) to a second frequency ($f_2$) corresponding to a second wavelength ($\lambda_2$), wherein the second wavelength is shorter than the first wavelength, the system consisting essentially of:
   a plurality of nested sleeves, wherein each sleeve includes one or more layers of dielectric substrate having a conductive array of fractal resonators disposed thereon, wherein the resonators of each sleeve are separated by a non-zero distance corresponding, when the system is operating at the first frequency ($f_1$) corresponding to the first wavelength ($\lambda_1$), to less than $\frac{1}{5}\lambda_1$, wherein each of the plurality of nested sleeves is held by a non-electrically-conductive frame and separated from each other sleeve by a non-zero radial distance and not galvanically connected to any other sleeve over that distance;
   wherein the predetermined frequency range is dependent upon the physical dimensions of the sleeves and resonators; and
   wherein, in operation, the system produces a 3 dB passband of 2:1 or greater.

2. The system of claim 1, wherein the one or more sleeves comprise a plurality of sleeves that are separated by an air gap or dielectric material.

3. The system of claim 2, wherein the plurality of sleeves comprises a pair of sleeves, and wherein the adjacent separations of resonators are ⅛$\lambda_1$ at the first frequency ($f_1$).

4. The system of claim 1, wherein the one or more nested sleeves are configured around a pre-existing antenna for enhancement of the radiation characteristics of the antenna.

5. The system of claim 1, wherein the one or more nested sleeves are hemispherical.

6. The system of claim 1, wherein the one or more nested sleeves are cylindrical.

7. The system of claim 1, wherein the one or more nested sleeves are spherical.

8. The system of claim 1, wherein each sleeve is configured and arranged to be opened and closed to allow placement of an antenna within the respective sleeve.

9. The system of claim 1, wherein the conductive array of resonators comprises a second order or higher fractal.

10. The system of claim 9, wherein said fractal is selected from the group consisting of a Koch fractal, a Minkowski fractal, a Cantor fractal, a torn square fractal, a Mandelbrot, a Caley tree fractal, a monkey's swing fractal, a Sierpinski gasket, and a Julia fractal.

11. The system of claim 9, wherein the fractal is selected from the group consisting of a contour set fractal, a Sierpinski triangle fractal, a Menger sponge fractal, a dragon curve fractal, a space-filling curve fractal, a Koch curve fractal, an Lypanov fractal, and a Kleinian group fractal.

12. The system of claim 1, wherein the one or more nested sleeves are configured and arranged for operation at K band, Ka band, or X-band.

13. The system of claim 1, wherein the one or more nested sleeves are configured as an antenna.

14. The system of claim 1, wherein the resonator shapes of one sleeve are about 1.5 cm on a side.

* * * * *